(12) United States Patent
Rao et al.

(10) Patent No.: US 9,330,040 B2
(45) Date of Patent: May 3, 2016

(54) SERIAL CONFIGURATION OF A RECONFIGURABLE INSTRUCTION CELL ARRAY

(71) Applicant: QUALCOMM Incorporated, San Diego, CA (US)

(72) Inventors: Hari Rao, San Diego, CA (US); Ioannis Nousias, San Diego, CA (US); Sami Khawam, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/025,646

(22) Filed: Sep. 12, 2013

(65) Prior Publication Data

US 2015/0074324 A1   Mar. 12, 2015

(51) Int. Cl.

| | | |
|---|---|---|
| *G06F 3/00* | (2006.01) | |
| *G06F 13/28* | (2006.01) | |
| *G06F 13/00* | (2006.01) | |
| *G06F 13/40* | (2006.01) | |
| *G06F 12/12* | (2016.01) | |
| *G06F 1/16* | (2006.01) | |
| *G06F 15/80* | (2006.01) | |
| *G06F 1/08* | (2006.01) | |
| *H03K 19/177* | (2006.01) | |

(52) U.S. Cl.
CPC .............. *G06F 13/4022* (2013.01); *G06F 1/08* (2013.01); *G06F 1/1615* (2013.01); *G06F 12/125* (2013.01); *G06F 15/80* (2013.01); *H03K 19/1776* (2013.01); *H03K 19/17756* (2013.01)

(58) Field of Classification Search
CPC ......... G06F 1/08; G06F 15/80; G06F 12/125; G06F 1/1615
USPC .................... 710/10, 8, 15, 26, 104
See application file for complete search history.

(56) References Cited

U.S. PATENT DOCUMENTS

| | | | | |
|---|---|---|---|---|
| 3,546,684 | A * | 12/1970 | Czarcinski et al. ............. | 710/51 |
| 4,007,449 | A * | 2/1977 | Vercesi .......................... | 710/58 |
| 5,426,378 | A | 6/1995 | Ong | |
| 5,498,975 | A * | 3/1996 | Cliff et al. ....................... | 326/10 |
| 5,646,545 | A | 7/1997 | Trimberger et al. | |
| 5,968,196 | A | 10/1999 | Ramamurthy et al. | |
| 5,978,870 | A * | 11/1999 | Warren .......................... | 710/71 |
| 5,995,988 | A | 11/1999 | Freidin et al. | |
| 6,091,263 | A | 7/2000 | New et al. | |
| 6,519,680 | B2 * | 2/2003 | Fujimoto et al. .............. | 711/114 |
| 6,647,461 | B2 * | 11/2003 | Fujimoto et al. .............. | 711/114 |
| 6,665,816 | B1 * | 12/2003 | Edwards et al. ................ | 714/30 |
| 6,675,284 | B1 * | 1/2004 | Warren .......................... | 712/38 |
| 6,728,799 | B1 * | 4/2004 | Perner et al. .................... | 710/52 |
| 6,801,960 | B1 * | 10/2004 | Ericson et al. .................. | 710/33 |

(Continued)

OTHER PUBLICATIONS

International Search Report and Written Opinion—PCT/US2014/054769—ISA/EPO—Jan. 28, 2015.

*Primary Examiner* — Idriss N Alrobaye
*Assistant Examiner* — Getente A Yimer
(74) *Attorney, Agent, or Firm* — Haynes and Boone, LLP

(57) ABSTRACT

A reconfigurable instruction cell array (RICA) includes a plurality of switch boxes. Each switch box includes an instruction cell and a switch fabric configurable according to a configuration word stored in each switch box. The switch boxes are arranged into serial loading sets such that the switch boxes in each serial loading set are configured to form a multi-bit shift register chain for serial shifting the corresponding configuration words.

14 Claims, 6 Drawing Sheets

(56) References Cited

U.S. PATENT DOCUMENTS

| | | | |
|---|---|---|---|
| 6,901,455 B2 * | 5/2005 | Gough | 710/8 |
| 6,985,989 B2 * | 1/2006 | Fujimoto et al. | 710/305 |
| 7,167,404 B2 | 1/2007 | Pathak et al. | |
| 8,018,249 B2 | 9/2011 | Koch et al. | |
| 2004/0139253 A1 * | 7/2004 | Perego et al. | 710/71 |
| 2005/0285862 A1 * | 12/2005 | Noda et al. | 345/502 |
| 2008/0222339 A1 * | 9/2008 | Claydon et al. | 710/306 |

* cited by examiner

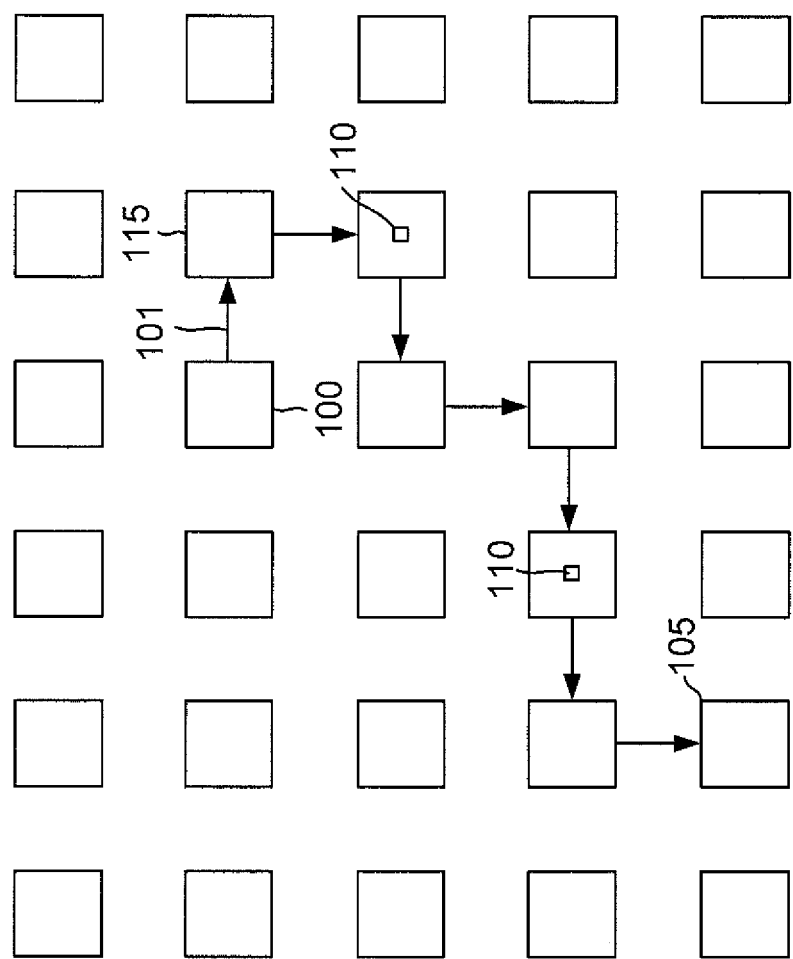

TECHNICAL FIELD

This application relates to reconfigurable computing, and more particularly to an array of instruction cells configured to receive their configuration data in series.

BACKGROUND

Although processor speeds have been progressively increased, the need for increased computing power remains unabated. For example, smart phones now burden their processors with a bewildering variety of tasks. But a single-core processor can only accommodate so many instructions at a given time. Thus, it is now common to provide multi-core or multi-threaded processors that can process sets of instructions in parallel. But such instruction-based architectures must always battle the limits imposed by die space, power consumption, and complexity with regard to decreasing the instruction processing time.

As compared to the use of a programmable processing core, there are many algorithms that can be more efficiently processed in dedicated hardware. For example, image processing involves substantial parallelism and processing of pixels in groups through a pipeline of processing steps. If the algorithm is then mapped to hardware, the implementation takes advantages of this symmetry and parallelism. But designing dedicated hardware is expensive and also cumbersome in that if the algorithm is modified, the dedicated hardware must be redesigned.

To provide an efficient compromise between instruction-based architectures and dedicated hardware approaches, a reconfigurable instruction cell array (RICA) architecture has been developed. FIG. 1A illustrates an example RICA system 50 having a reconfigurable core 1. In RICA 50, a plurality of instruction cells 2 such as adders (ADD), multipliers (MUL), registers (REG), logic operation shifters (SHIFT), dividers (DIV), data comparators (COMP), logic gates (LOGIC), and logic jump cells (JUMP) are interconnected through a programmable switch fabric 4. The configuration of instruction cells 2 with regard to their logical function or instruction they implement can be reprogrammed as necessary to implement a given algorithm or function. Switch fabric 4 would be reprogrammed accordingly as well. Instruction cells 2 include memory interface cells 12 that interface data for remaining ones of the instructions cells 2 as retrieved or loaded into a data memory 8. The resulting processing by instruction cells 2 occurs according to configuration instructions 10 obtained from a configuration RAM 6. A decode module 11 decodes instructions 10 to not only get the configuration data for instructions cells 2 but also for switching fabric 4. RICA 50 interfaces with external systems through I/O ports 16 and specialized instructions cell registers 14. Additional features shown in FIG. 1A are described in U.S. Patent Publication No. 2010/0122105, filed Apr. 28, 2006, the contents of which are hereby incorporated by reference in their entirety.

The instruction cells in a reconfigurable array may be arranged by rows and columns. Each instruction cell, any associated register, and an associated input and output switching fabric for the instruction cell may be considered to reside within a switching box. FIG. 1B shows an example array of switch boxes arranged in rows and columns. A datapath formed between selected switch boxes is carried on selected channels from a plurality of channels. The plurality of channels are also arranged in rows and columns matching the rows and columns for the switch boxes. Each channel has a certain width in bits. The row directions may be considered to run east and west whereas the column directions run north and south. A datapath beginning in an instruction cell in an initial switchbox 100 routes on an output channel 101 in an east row direction. The routing for the datapath from subsequent switch boxes is in the appropriate east/west row direction or north/south column direction such that a final switch box 105 at some selected row and column position is reached. In this example data path, two instruction cells are configured as arithmetic logic units (ALUs) 110. The instruction cells for the remaining switch boxes are not shown for illustration clarity. Each switch box includes two switch matrices or fabrics: an input switch fabric to select for channel inputs to its instruction cell and also an output switch fabric to select for the channel outputs from the switch box. These switch fabrics for the instruction cells are shown collectively in FIG. 1A as switch fabric 4.

In contrast to an instruction cell, the logic block in a field programmable gate array (FPGA) uses lookup tables (LUTs). For example, suppose one needs an AND gate in the logic operations carried out in a configured FPGA. A corresponding LUT would be programmed with the truth table for the AND gate logical function. But an instruction cell is much "coarser-grained" in that it contains dedicated logic gates. For example, an ALU instruction cell would include assorted dedicated logic gates. It is the function of the ALU instruction cell that is configurable—its primitive logic gates are dedicated gates and thus are non-configurable. For example, a conventional CMOS inverter is one type of dedicated logic gate. There is nothing configurable about such an inverter, it needs no configuration bits. But the instantiation of an inverter function in a FPGA programmable logic block is instead performed by a corresponding programming of a LUT's truth table. Thus, as used herein, the term "instruction cell" refers to a configurable logic element that comprises dedicated logic gates.

An ALU instruction cell performs its logical functions on one or more operands. An operand in this context is a received channel input. Depending upon its configuration bits, an ALU instruction cell is configured to perform corresponding logical operations. For example, a first switch box may include an ALU instruction cell configured to add two operands corresponding to two channel inputs. But the same ALU instruction cell may later be updated to subtract the two operands. The operands that result from the logical operation within the instruction cell may be required in another instruction cell. Thus, the output switch fabric in the first switch box would be configured to drive the resulting operands out of the first switch box through corresponding channel outputs. In contrast, an FPGA's LUTs produce a bit, they do not generate words. So the switch fabric in an FPGA is fundamentally different from the switch fabrics in a RICA in that an FPGA's switch fabric is configured to route the bits from the FPGA's LUTs. In contrast, the routing between switch boxes in a RICA is configured to route words as both input channels and output channels. For example, a switch box array may be configured to route 20 channels. Switch boxes in such an embodiment may thus receive 20 input channels from all four directions and drive 20 output channels in the four directions.

Note the advantages of a RICA: since the instruction cells comprise dedicated logic gates, the necessary amount of configuration data is substantially less than the configuration data for a comparable FPGA. The switch boxes may thus be readily reconfigured over a relatively brief delay such that the reconfiguration is effectively real-time to a companion processor. In contrast, the relatively massive amount of configuration data for an FPGA requires considerable delay for its reconfiguration. A RICA also has processing speed advantages as compared to software-based implementations in a traditional processor. For example, an algorithm such as image processing that involves processing multiple pixels through a pipelined processing scheme can be mapped to instruction cells in a manner that emulates a dedicated hardware approach. But there is no need to design dedicated hardware. Instead one can merely configure the instruction cells and switching fabrics as necessary. Thus, if an algorithm must be redesigned, there is no need for hardware redesign but instead a user may merely change the configuration data. This is quite advantageous over traditional instruction-based computing approaches.

Although a RICA thus offers robust advantages, challenges remain in its implementation. For example a number of configuration bits are required for configurable elements within each switch box such as for the configuration of the instruction cell and switching fabrics. Each switching box thus requires storage elements or cells for storing its configuration bits. In one example embodiment, an array of twenty rows and twenty columns (resulting in 400 switch boxes) requires 77 kilobits for its configuration. The circuitry for the loading of so many configuration bits consumes valuable die space and power. In addition, a RICA requires a minimum latency for the loading of the configuration bits. In that regard, an instruction cell is not statically programmed in a RICA— for example, an instruction cell can be reconfigured several times during normal operation. It may not need such frequent reprogramming but the capability should be provided. Since other systems such a microprocessor may be interfacing with a RICA, the latency of the reconfiguration must be minimized to prevent stalls.

Accordingly, there is a need in the art for area-efficient and low-latency configuration schemes for reconfigurable instruction cell arrays.

SUMMARY

To provide an area-efficient yet low latency configuration scheme, the switch boxes in a reconfigurable instruction cell array (RICA) are organized into serial loading sets. Each serial loading set forms a multi-bit shift register that shifts the multi-bit configuration words through the serial loading set's switch boxes. In one embodiment, the switch box array for a RICA is organized into rows and columns such that each serial loading set spans across all or a portion of a column or row. If a row or column of switch boxes are split into two serial loading sets, the configuration time necessary to shift in the desired configuration words into each serial loading set is reduced.

BRIEF DESCRIPTION OF THE DRAWINGS

FIG. 1B is a block diagram for an array of switch boxes in the RICA of FIG. 1A.

Embodiments of the present invention and their advantages are best understood by referring to the detailed description that follows. It should be appreciated that like reference numerals are used to identify like elements illustrated in one or more of the figures.

DETAILED DESCRIPTION

Figure 1A:
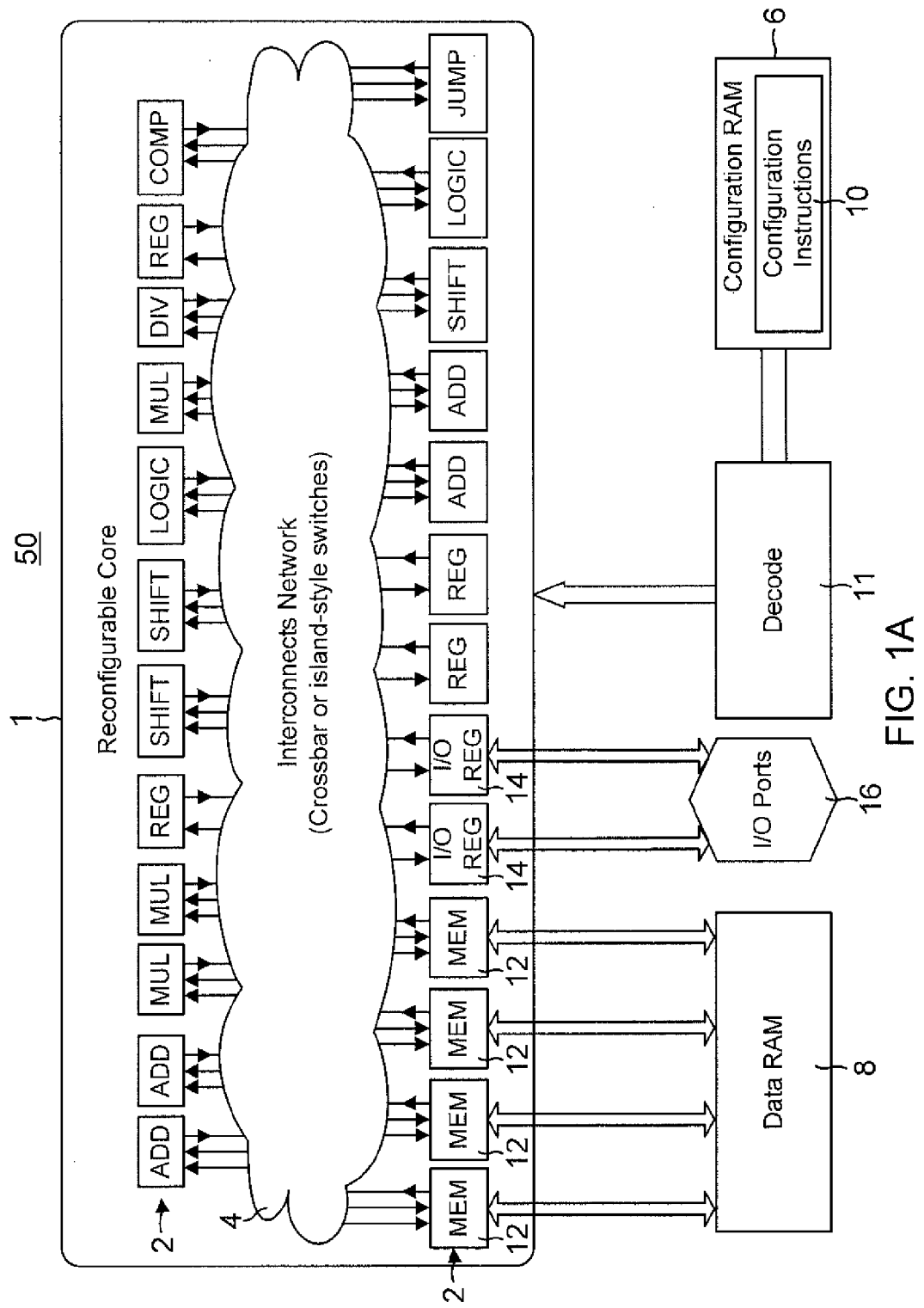
FIG. 1A is a block diagram for an example reconfigurable instruction cell array (RICA).

A reconfigurable instruction cell array (RICA) is provided in which the configuration data is shifted serially into chains of switch boxes. The configuration data to configure the instruction cell and input and output switch fabric in a switch box forms a configuration word comprising a plurality of configuration bits ranging from a first configuration bit to a last configuration bit. The input and output switch fabrics for each switch box are referred to herein collectively as a single switch fabric. Each switch box includes an n-bit register adapted for the storage of an n-bit configuration word, where is a plural positive integer. As used herein, the term "register" without clarification refers to a one-bit register. Thus, an n-bit register comprises n registers. For example, a first register in an n-bit register for a switch box is configured to store a first configuration bit of switch box's configuration word. Similarly, a second register in an n-bit register is configured to store a corresponding second configuration bit for the configuration word and so on such that a final (or nth) register in an n-bit register is configured to store a corresponding final configuration bit for the configuration word.

In one RICA embodiment, each switch box not only stores a current-state configuration word for its instruction cell and switch fabric but also stores a next-state configuration word. Each switch box in such an embodiment includes a current-state storage cell array for storing the current-state configuration word as well as a next-state n-bit register for storing the next-state configuration word. The switch boxes respond to an update signal by loading the next-state configuration word from its next-state n-bit register array into the current-state storage cell array. The serial configuration architecture is described herein with regard to the loading of the next-state configuration words into the next-state n-bit registers. However, embodiments of the disclosed loading scheme are also widely applicable to reconfigurable instruction cell arrays that load only current configuration words. In that regard, the next-state n-bit registers disclosed herein are simply referred to as "n-bit registers" for brevity unless otherwise required.

The array of switch boxes in a RICA may be arranged into rows and columns. It will be appreciated that what is denoted as a "row" versus what is a "column" is simply a matter of perspective. Thus, the terms row and column are used herein without loss of generality. To enable an advantageous serial loading of configuration words, the n-bit registers in a serial loading set of switch boxes are configured to form an n-bit shift register. An n-bit shift register comprises a parallel arrangement of n shift registers corresponding to their configuration bits. For example, the registers configured to store a first configuration bit from the respective configuration words for a serial loading set of switch boxes are arranged into a first shift register. Similarly, the registers configured to store a second configuration bit for a serial loading set of switch boxes are arranged into a second shift register and so on such that the registers configured to store a last configuration bit in a serial loading set are arranged into a last shift register. The registers in a serial loading set of switch boxes are thus arranged into an array of shift registers ranging from a first shift register to a last shift register to form an n-bit shift register. More generally, such an n-bit shift register may be denoted as a multi-bit shift register because it serially shifts multi-bit configuration words. The multi-bit shift register for each serial loading set in one embodiment forms a means for serially shifting configuration words until each switch box in the serial loading set stores its corresponding configuration word.

The switch boxes in a serial loading set are arranged from a first switch box to a last switch box. The data input terminal for the n-bit register in the first switch box couples to a corresponding configuration bus, which comprises a plurality of configuration bit conductors corresponding to the plurality of configuration bits. Thus, just like the registers in each switch box, a first one of the configuration bit conductors in a configuration bus is configured to propagate the first configuration bits for the configuration words for the corresponding serial loading set of switch boxes. Similarly, a second one of the configuration bit conductors in a configuration bus is configured to propagate the second configuration bits for the serial loading set, and so on. To better illustrate the features for a serial loading set of switch boxes, some example embodiments will now be discussed.

Example Embodiments

Figure 2:
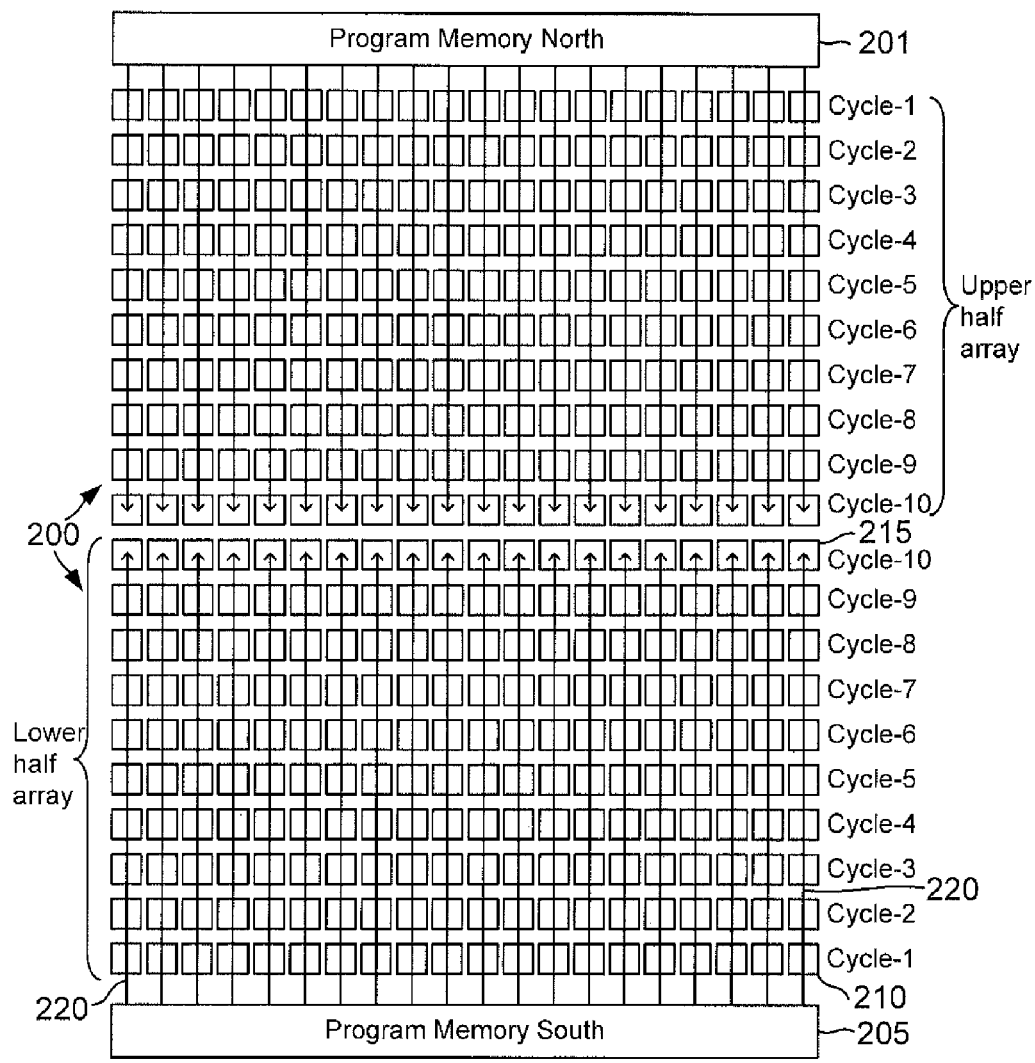
FIG. 2 shows an array of switch boxes arranged into serial loading sets.

FIG. 2 illustrates an embodiment in which a switch box array 200 comprises twenty rows and twenty columns of switch boxes. Each column is split in half with regard to the serial loading of the configuration data such that switch box array 200 comprises an upper half array and a lower half array. Each half column of switch boxes in each half array is adapted to form a serial loading set. For example, one serial loading set in the lower half array extends from a switch box 210 to a switch box 215. A configuration memory for each half array drives the half array's serial loading set. A configuration memory north 201 drives the upper half array and a configuration memory south 205 drives the lower half array. Each configuration memory 201 and 205 is configured to drive configuration words into the serial loading sets for its corresponding half array. For example, south memory 205 is configured to drive configuration words into the serial loading set extending from switch box 210 to switch box 215 as well as into the remaining serial loading set for the lower half array. In one embodiment, each configuration word width is 192 bits. The configuration of a row of twenty switch boxes in such an embodiment thus requires 20*192 bits, which equals 3840 bits. Since there are twenty rows in array 200, the configuration data for array 200 would then comprise 20*3840 bits, which equals approximately 77 kbits.

In an alternative embodiment, a single configuration memory could store all the configuration words. Each serial loading set would then extend across a corresponding full column of array 200. But as will be explained further herein, the loading time for the configuration process is halved in embodiments in which the array is arranged into half arrays each having their own serial loading sets such in array 200.

Figure 3:
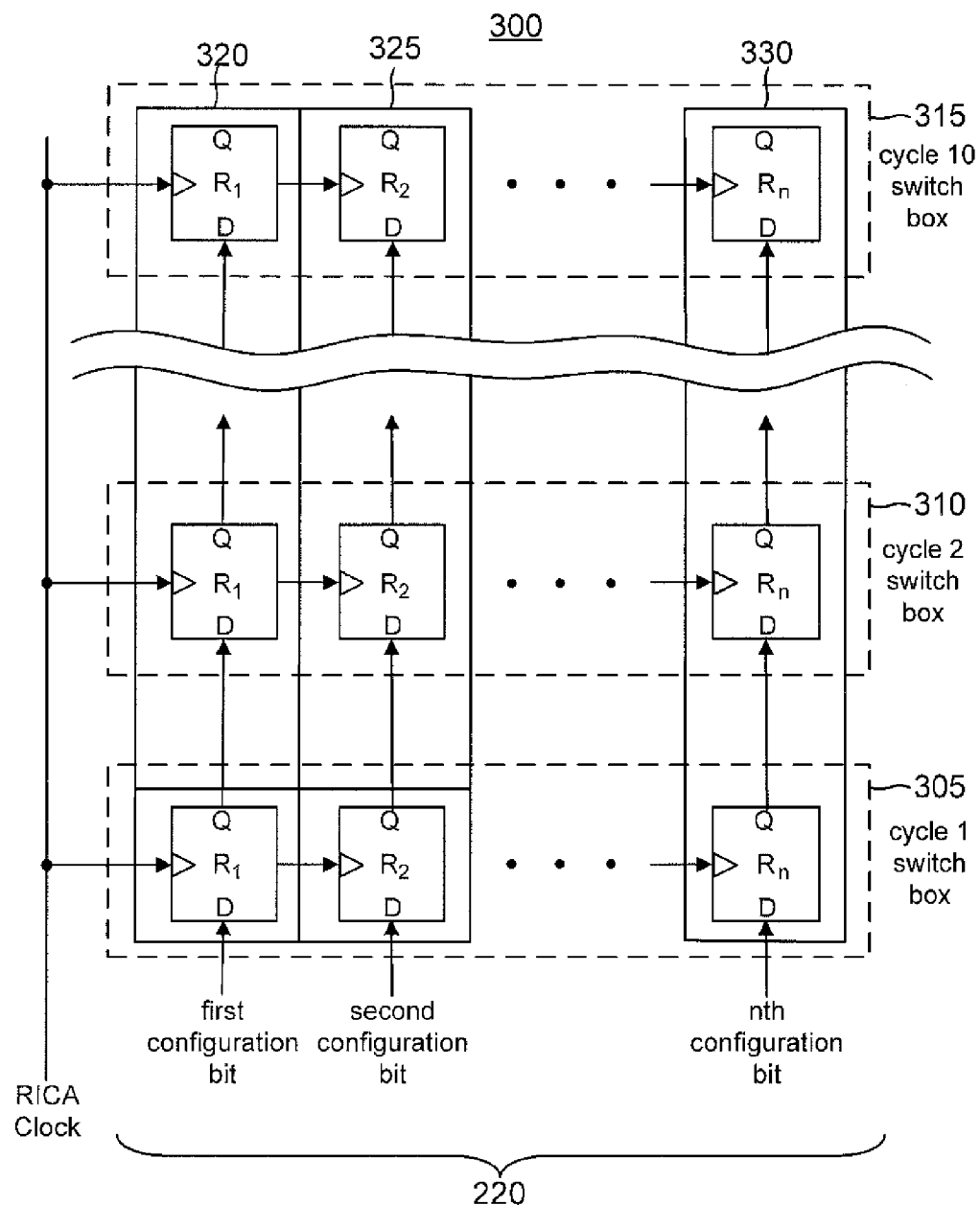
FIG. 3 is a schematic for a multi-bit shift register in a serial loading set of switch boxes.

FIG. 3 illustrates an example serial loading set 300 of switch boxes. For illustration clarity, each switch box is represented by its n-bit register for storing its configuration word. For example, an initial cycle 1 switch box is represented by its n-bit register 305, an adjacent cycle 2 switch box is represented by its n-bit register 310, and so on such that a final cycle 10 switch box is represented by its n-bit register 315. The various n-bit registers are arranged to form an n-bit shift register starting from n-bit register 305 and ending in n-bit register 315.

The registers in the n-bit registers are designated by the bit they store of their respective configuration words. Each configuration word is n bits wide, where n is the positive integer representing the number of bits in the configuration word width. In that regard, each configuration word comprises a series of bits ranging from a first bit to a final nth bit. The registers in each n-bit register are thus arranged from a first register R1 that stores the first configuration bit, a second register R2 that stores the second configuration bit, and so on to a final register Rn that stores the nth configuration bit.

The n-bit shift register includes a first shift register 320 that comprises the R1 register from each switch box. Thus, shift register 320 functions to shift the first configuration bits for the configuration words used to program serial loading set 300. Similarly, a second shift register 325 comprises the R2 register from each switch box, and so on such that a final shift register 330 comprises the Rn register from each switch box. Each register R1 through Rn is configured to register responsive to cycles of a RICA clock. Thus, as the RICA clock cycles, a configuration word is transferred from switch box to subsequent switch box in serial loading set 300.

Referring again to FIG. 2, switch box 210 of array 200 is a cycle 1 switch box. The designation "cycle 1" is used because the cycle 1 switch box is the switch box that has its n-bit register store a configuration word during the first RICA clock cycle in a RICA configuration process (for illustration clarity, the RICA clock is not shown in FIG. 2). N-bit register 305 in the cycle 1 switch box registers a first configuration word in the first cycle of the RICA clock during the configuration of serial loading set 300. The first configuration word is then presented at the Q outputs of the registers in n-bit register 305.

The Q outputs from the registers in n-bit register 305 drive the data inputs (D) for the corresponding registers in n-bit register 310 in a cycle 2 switch box. The designation "cycle 2" is used because a cycle 2 switch box first registers a configuration word in the second RICA clock cycle during a RICA configuration process. N-bit Register 310 will thus register the first configuration word in cycle 2 of the RICA clock. In this fashion, configuration words are serially shifted through the switch boxes in serial loading set until a final cycle 10 switch box registers the first configuration word in a tenth RICA clock cycle in n-bit register 315. All the switch boxes in serial loading set 300 thus register their corresponding configuration word at the tenth RICA clock cycle. More generally, in a serial loading set having an arbitrary number x of rows of switch boxes, the switch boxes would register their corresponding configuration word in the xth RICA clock cycle.

Note that the splitting of the columns in array 200 of FIG. 2 into half columns decreases the configuration time as compared to an embodiment in which the serial loading sets spanned all the rows. For example, in an embodiment with twenty rows that are not split into half arrays, the configuration process may require twenty clock RICA cycles. But the serial loading sets of FIG. 2 require only ten RICA clock cycles for their configuration.

Figure 4:
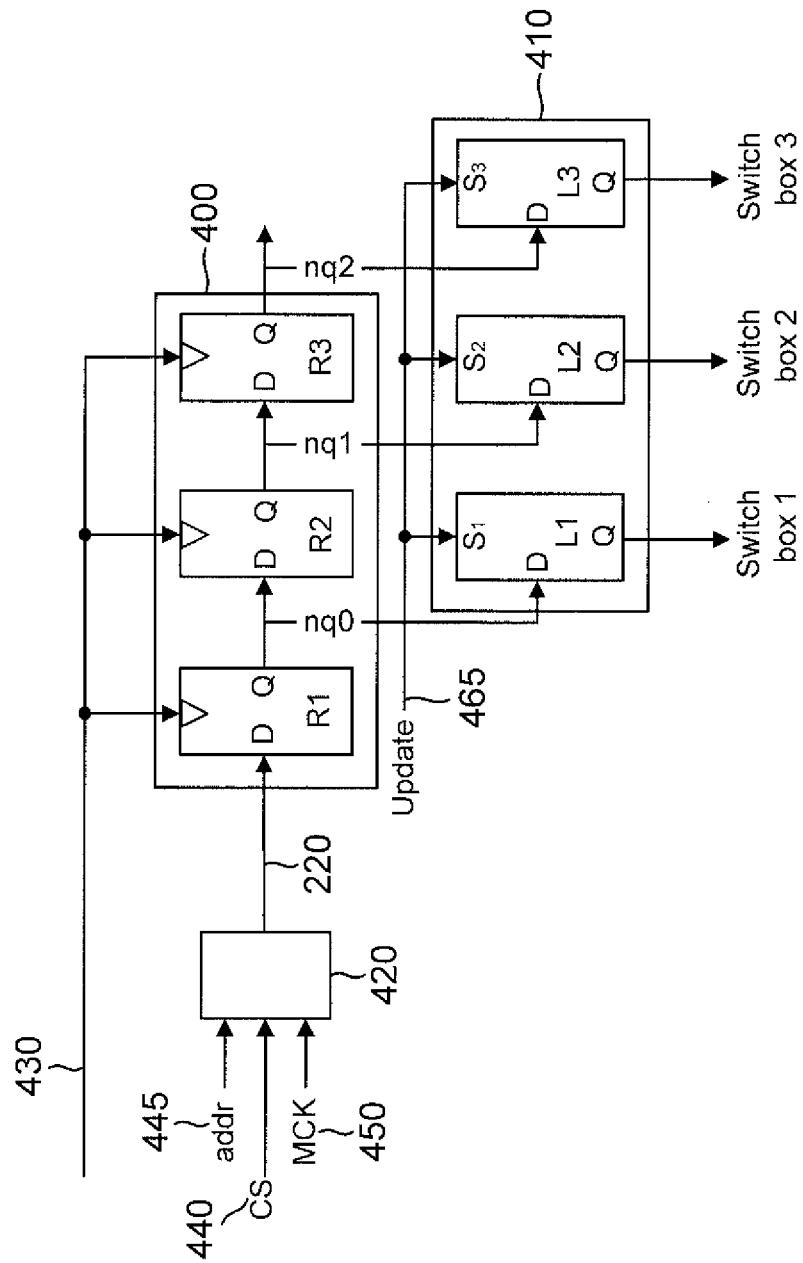
FIG. 4 is a schematic for an example serial loading set including a current state latch array.

FIG. 4 shows an example n-bit shift register 400 to better illustrate the serial loading process. For illustration clarity, only three n-bit registers R1, R2, and R3 are shown in shift register 400. Thus, the serial loading set of switch boxes (not illustrated) that includes n-bit shift register 400 would comprise just three switch boxes. In this embodiment, the configuration words shifted into n-bit shift register 400 are next-state configuration words. An n-bit register R1 latches a next-state configuration word in a first clock cycle of a RICA clock 430. Since n-bit register R1 is the initial n-bit register in n-bit shift register 400, a configuration memory 420 drives the first configuration word over configuration bus 220 into a data input terminal for n-bit register R1. Configuration memory 420 is enabled to retrieve configuration words responsive to a chip select (CS) signal 440. When CS 440 is asserted, configuration memory 420 retrieves configuration words responsive to an address signal (addr) 445 and a memory clock (MCK) 450.

Each n-bit register R1 through R3 registers it data input during each cycle of RICA clock 430. Thus, in a second RICA clock cycle, n-bit register R2 registers the first next-state configuration word initially registered in n-bit register R1. In a third RICA clock cycle, this first next-state configuration word in then registered by n-bit register R3. In this fashion, the next-state configuration word that had been stored in n-bit register R1 in a first RICA clock cycle is stored in n-bit register R3 in a third RICA clock cycle. At this point, the next-state configuration words have been fully loaded into n-bit shift register 400. An update signal 455 may then be asserted to cause the next-state configuration words to be shifted in parallel to a current-state latch array 410. Analogous to next-state shift register 400, current-state latch array 410 includes n-bit latches L1, L2, and L3 corresponding to n-bit registers R1, R2, and R3, respectively. Like the n-bit registers, the n-bit latches correspond to the switch boxes such that n-bit latch L1 corresponds to a first switch box, n-bit latch L2 corresponds to a second switch box, and n-bit latch L3 corresponds to a third switch box.

Update signal 455 acts as a set (S) signal for n-bit latches L1, L2, and L3. As used herein, a "latch" refers to a storage cell that is configured to latch a data input responsive to the level (high or low) of a set signal. In contrast, the term "register" as used herein refers to a storage cell that comprises two one-bit latches per bit stored so that the resulting structure is edge sensitive (rising or falling edge) for a clock signal. Since there is no need for a shifting ability, it thus saves area to store the current-state configuration words for a serial loading set of switch boxes in latches. The current-state configuration words are then available to configure the instruction cell and switch fabrics in the corresponding switch boxes. However, it will be appreciated that latch array 410 may be replaced by an n-bit shift register in alternative embodiments. An example method of operation will now be discussed.

Example Method of Operation

Figure 5:
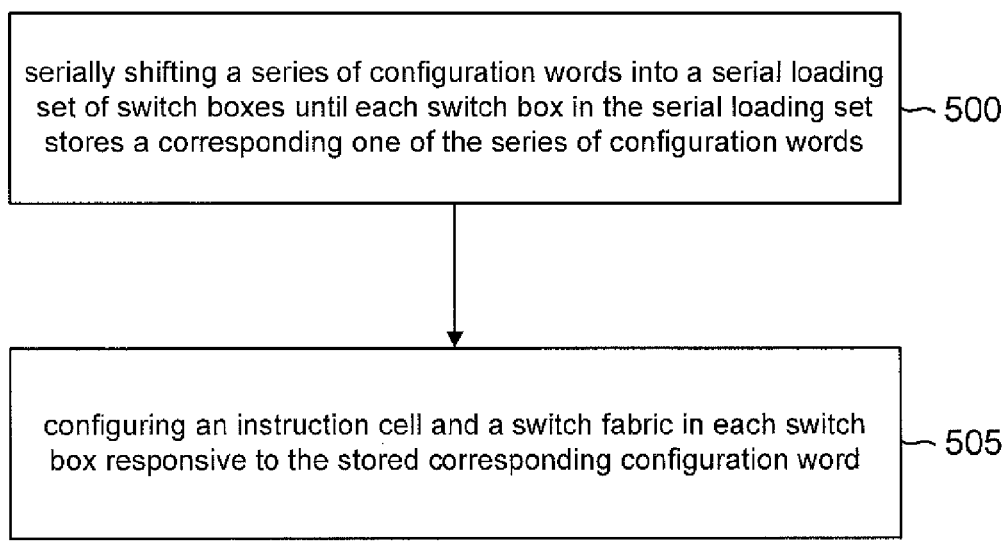
FIG. 5 is a flowchart for a method of serially loading configuration words into a serial loading set of switch boxes.

A flowchart for an example method of serially loading configuration words to a serial loading set of switch boxes for a reconfigurable instruction cell array is shown in FIG. 5. The method begins with an act 500 of serially shifting a series of configuration words into a serial loading set of switch boxes until each switch box in the serial loading set stores a corresponding one of the configuration words. For example, suppose the serial loading set of switch boxes comprises three switch boxes serially arranged as a first switch box, a second switch box, and a third switch box. The corresponding series of configuration words would thus comprise a first configuration word for the first switch box, a second configuration word for the second switch box, and a third configuration word for the third switch box. The method then continues with an act 505 of configuring an instruction cell and a switch fabric in each switch box responsive to the stored corresponding configuration word.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A reconfigurable instruction cell array (RICA), comprising:
an array of switch boxes organized into a plurality of serial loading sets, wherein for each serial loading set, the corresponding switch boxes are arranged from a first switch box to a last switch box, each switch box including a programmable instruction cell comprising dedicated logic gates configurable to process an input word to produce an output word and a switch fabric both being configurable according to a corresponding configuration word to program a function of the programmable instruction cell and to program a routing of the input word through the switch fabric and to program a routing of the output word through the switch fabric, each switch box including an n-bit register configured to store the corresponding configuration word, wherein each configuration word comprises a plurality of n configuration bits, n being a plural integer, wherein the switch boxes are arranged into a plurality of rows and a plurality of columns, and wherein the plurality of serial loading sets comprises a first plurality of the serial loading sets are arranged in an upper half of each column and comprises a second plurality of the serial loading sets arranged in a lower half of each column; and
wherein the n-bit registers for each serial loading set are arranged to form an n-bit shift register configured to serially shift configuration words through the serial loading set responsive to cycles of a RICA clock.

2. The RICA of claim 1, further comprising:
a first memory for storing the configuration words for the first plurality of the serial loading sets; and
a second memory for storing the configuration words for the second plurality of the serial loading sets.

3. The RICA of claim 2, wherein the first memory and the second memory are each configured to drive their stored configuration words into the corresponding plurality of serial loading sets responsive to cycles of the RICA clock.

4. The RICA of claim 1, further comprising:
a plurality of configuration busses corresponding to the plurality of serial loading sets, each configuration bus comprising a plurality of configuration bit conductors corresponding to the plurality of configuration bits, each configuration bit conductor configured to conduct the corresponding configuration bit, wherein for each serial loading set, the corresponding configuration bus is coupled to a data input terminal for the n-bit register in the serial loading set's first switch box.

5. The RICA of claim 4, further comprising a configuration memory configured to drive the configuration words into the plurality of configuration busses responsive to cycles of the RICA clock.

6. The RICA of claim 5, wherein the configuration memory is configured to drive the configuration words responsive to a chip select signal and an address signal.

7. The RICA of 1, wherein each n-bit shift register is configured to serially shift next-state configuration words, each switch box further comprising an n-bit latch array configured to store a next-state configuration word as a current-state configuration word responsive to an assertion of an update signal.

8. The RICA of claim 7, wherein for each serial loading set, the serial loading set's n-bit shift register extends from a first n-bit register to a last n-bit register, and wherein the n-bit latch array extends from a first n-bit latch corresponding to the first n-bit register to a last n-bit latch corresponding to the last n-bit register.

9. The RICA of claim 8, wherein for each serial loading set, each n-bit latch is configured to latch a current-state configuration word from the corresponding n-bit register responsive to the assertion of the update signal.

10. A method, comprising;
  for an array of switch boxes organized into rows and columns, wherein an upper half of each column of switch boxes comprises a first serial loading set of switch boxes and wherein a lower half of each column comprises a second serial loading set of switch boxes, serially shifting a first series of configuration words into each upper half of each column until each switch box in each first serial loading set stores a corresponding one of the configuration words;
  serially shifting a second series of configuration words into each lower half of each column until each switch box in each second serial loading set stores a corresponding one of the configuration words;
  in each switch box, configuring an instruction cell comprising dedicated logic gates to process an input word into an output word responsive to the stored corresponding configuration word; and
  configuring a switch fabric in each switch box to route the input and the output word responsive to the stored corresponding configuration word.

11. The method of claim 10, wherein serially shifting the first series of configuration words comprises serially shifting the first series of configuration words through a multi-bit shift register, wherein each switch box in each first serial loading set includes a corresponding multi-bit register for the multi-bit shift register, until each multi-bit register stores a corresponding configuration word in the series.

12. The method of claim 11, wherein the first series of configuration words are a series of next-state configuration words, the method further comprising loading the corresponding stored next-state configuration word from each multi-bit register into a corresponding multi-bit latch such that each multi-bit latch stores a current-state configuration word.

13. The method of claim 12, wherein the loading is responsive to an assertion of an update signal.

14. The method of claim 11, further comprising driving the multi-bit shift register with the first series of configuration words by retrieving the first series of configuration words from a programming memory.

\* \* \* \* \*